United States Patent
Scheiper et al.

(10) Patent No.: US 8,722,500 B2
(45) Date of Patent: May 13, 2014

(54) METHODS FOR FABRICATING INTEGRATED CIRCUITS HAVING GATE TO ACTIVE AND GATE TO GATE INTERCONNECTS

(75) Inventors: Thilo Scheiper, Dresden (DE); Stefan Flachowsky, Dresden (DE); Andy Wei, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 300 days.

(21) Appl. No.: 13/237,688

(22) Filed: Sep. 20, 2011

(65) Prior Publication Data

US 2013/0071977 A1 Mar. 21, 2013

(51) Int. Cl.
*H01L 21/336* (2006.01)
(52) U.S. Cl.
USPC ............ 438/299; 257/346; 257/387; 438/197
(58) Field of Classification Search
USPC ............................ 257/346, 387; 438/299, 197
See application file for complete search history.

(56) References Cited

U.S. PATENT DOCUMENTS

| 4,994,873 | A | * | 2/1991 | Madan | 257/315 |
| 2011/0193144 | A1 | * | 8/2011 | Sun et al. | 257/288 |

* cited by examiner

*Primary Examiner* — Kimberly Rizkallah
*Assistant Examiner* — Errol Fernandes
(74) *Attorney, Agent, or Firm* — Ingrassia Fisher & Lorenz, P.C.

(57) ABSTRACT

Methods are provided for fabricating an integrated circuit that includes gate to active contacts. One method includes processing the IC in a replacement gate technology including forming dummy gates, sidewall spacers on the dummy gates, and metal silicide contacts to active areas. A fill layer is deposited and planarized to expose the dummy gates and the dummy gates are removed. A mask is formed having an opening overlying a portion of the channel region from which the dummy gate was removed and a portion of an adjacent metal silicide contact. The fill layer and a portion of the sidewall spacers exposed through the mask opening are etched to expose a portion of the adjacent metal silicide contact. A gate electrode material is deposited overlying the channel region and exposed metal silicide contact and is planarized to form a gate electrode and a gate-to-metal silicide contact interconnect.

9 Claims, 12 Drawing Sheets

METHODS FOR FABRICATING INTEGRATED CIRCUITS HAVING GATE TO ACTIVE AND GATE TO GATE INTERCONNECTS

TECHNICAL FIELD

The present invention generally relates to methods for fabricating integrated circuits, and more particularly relates to methods for fabricating integrated circuits that include gate to active and gate to gate interconnects.

BACKGROUND

The majority of integrated circuits (ICs) are made of a large number of interconnected field effect transistors (FETs). As the size and complexity of ICs increase and the number of transistors incorporated in the IC increases, the reliable interconnection of the transistors becomes a consideration of paramount importance. Reliable interconnections become more of a concern as the minimum feature size and the minimum spacing between features are decreased to allow the increased number of transistors on an individual chip or die. Of particular concern are the interconnections between the gate of a FET and an associated active area (gate to active) and between the gates of two FETs (gate to gate).

In conventional IC fabrication the connection between gate and active area requires the etching of an opening through a thick interlayer dielectric (ILD). The opening must be larger than the opening for other contacts such as for active area to active area connections. The simultaneous etching of openings of two different sizes leads to severe challenges because the different sizes lead to different etch rates with the larger opening etching at a higher etch rate. The larger opening can be over etched resulting in attack of an underlying metal silicide and the degradation of the electrical connection and to potential yield loss.

The logical layout of an IC commonly uses complicated shapes of gate structures for short gate to gate connections. As the feature size and spacing decreases, such complicated shapes will not be possible because of process limitations. For example, for very small feature sizes the available photolithographic technology may not be able to reliably print such structures. As a result, gate to gate connections will have to be made by a metal interconnection between unidirectional gates.

Accordingly, it is desirable to provide reliable and simplified methods for fabricating integrated circuits having gate to active area and/or gate to gate interconnections. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating an integrated circuit that includes gate to active contacts and gate to gate interconnects. One embodiment includes processing the IC in a replacement gate technology including forming dummy gates, sidewall spacers on the dummy gates, and metal silicide contacts to active areas. A fill layer is deposited overlying the dummy gates and metal silicide contacts. The fill layer is planarized to expose the dummy gates and the dummy gates are removed. A mask is formed having an opening overlying a portion of the channel region from which the dummy gate was removed and a portion of an adjacent metal silicide contact. The fill layer and a portion of the sidewall spacers exposed through the mask opening are etched to expose a portion of the adjacent metal silicide contact. A gate electrode material is deposited overlying the channel region and exposed metal silicide contact and is planarized to form a gate electrode and a gate-to-metal silicide contact interconnect.

In accordance with another embodiment an integrated circuit having gate to gate interconnects is fabricated in a replacement gate technology that includes forming first and second dummy gate electrodes including sidewall spacers overlying first and second active regions that are separated by shallow trench isolation. End portions of the first and second dummy gate electrodes are formed to extend over the shallow trench isolation. An etch resistant layer and a fill layer are deposited overlying the first and second dummy gate electrodes and the shallow trench isolation and the fill layer is planarized to expose the first and second dummy gate electrodes. The first and second dummy gate electrodes are removed to form first and second trenches in the fill layer, the first and second trenches separated by the sidewall spacers and a portion of the fill layer overlying a portion of the shallow trench isolation. A layer of mask material is deposited and patterned to form a mask opening exposing at least a portion of the first and second trenches, the sidewall spacers, and the portion of the fill layer overlying the portion of the shallow trench isolation. The portion of the fill layer is etched, the sidewall spacers are recessed, and a work function-determining material and gate electrode material are deposited to fill the first and second trenches and overlying the portion of the shallow trench isolation. The gate electrode material is planarized to form first and second gate electrodes and a gate to gate interconnect overlying the portion of the shallow trench isolation.

In accordance with yet another embodiment a method is provided for fabricating an integrated circuit having gate to active contacts. The method includes forming a dummy gate structure including a dummy gate electrode overlying a barrier layer and a sidewall spacer on a sidewall of the dummy gate electrode. A metal silicide contact to a source/drain region is formed adjacent to the sidewall spacer and an oxide layer is deposited overlying the metal silicide contact. The dummy gate electrode is removed and an etch mask is formed that exposes a portion of the barrier layer and a portion of the oxide layer. The exposed portion of the oxide layer and a portion of the sidewall spacer are etched and a layer work function-determining material is deposited. A layer of gate electrode-forming material is deposited overlying the work function-determining metal and the metal silicide. The layer of gate electrode material is planarized to form a gate electrode and a gate-to-metal silicide interconnect.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
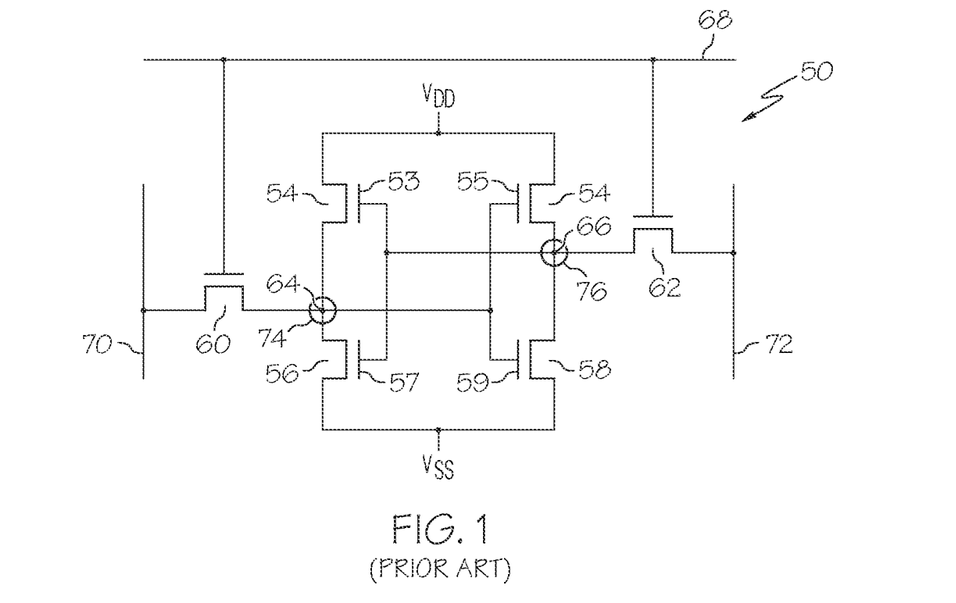
FIG. 1 schematically illustrates a conventional six transistor static RAM cell.

FIG. 1 illustrates a conventional six transistor static random access memory (SRAM) cell 50 that serves to illustrate two problems addressed by various embodiments of the present invention. SRAM cell 50 includes two p-channel field effect transistors (PFETs) 52 and 54 and two n-channel field effect transistors (NFETs) 56 and 58 that are connected as two cross coupled inverters. Two NFETs 60 and 62 are coupled to the inverter nodes 64 and 66, respectively, and provide access to the cell. The gates of the two access transistors are coupled to word line (WL) 68. NFET 60 is coupled to bit line 70 and NFET 62 is coupled to complementary bit line 72. The sources of PFETs 52 and 54 are coupled to VDD and the sources of NFETS 56 and 58 are coupled to VSS. The drain of PFET 52 is coupled to the drain of NFET 56 and the drain of PFET 54 is coupled to the drain of NFET 58. The gate 53 of PFET 52 is coupled to the gate 57 of NFET 56 and to the drain of PFET 54. Similarly, the gate 55 of PFET 54 is coupled to the gate 59 of NFET 58 and to the drain of PFET 56. As the feature size decreases, it becomes difficult to reliably fabricate the connection between gates and active areas (drains in this example) indicated by circles 74 and 76 and to reliably fabricate the gate to gate connections between the gates of the PFETs and the NFETs. These problems occur in many types of ICs, not just SRAMs, but are easily illustrated by the SRAM cell. Accordingly, it is not intended that the invention be limited to SRAMs, as it is widely applicable to many ICs.

Figure 2:
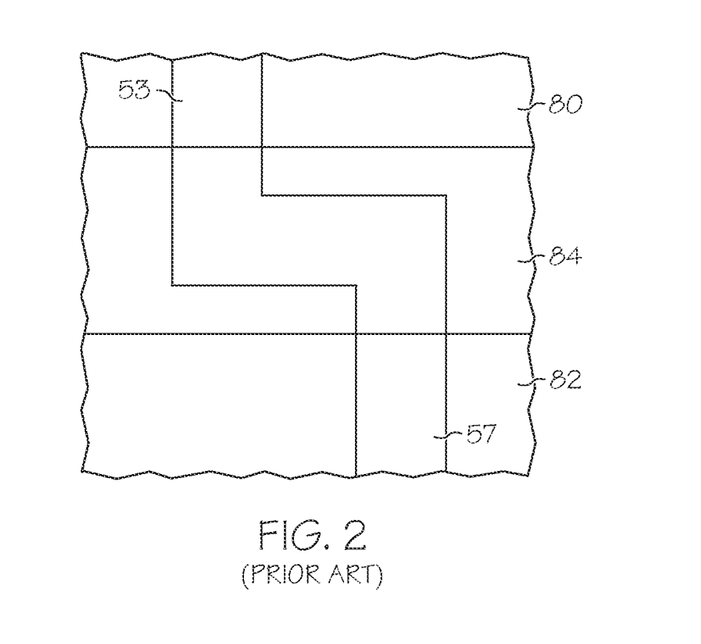
FIG. 2 illustrates, in plan view, a conventional gate to gate connection.
Figure 3:
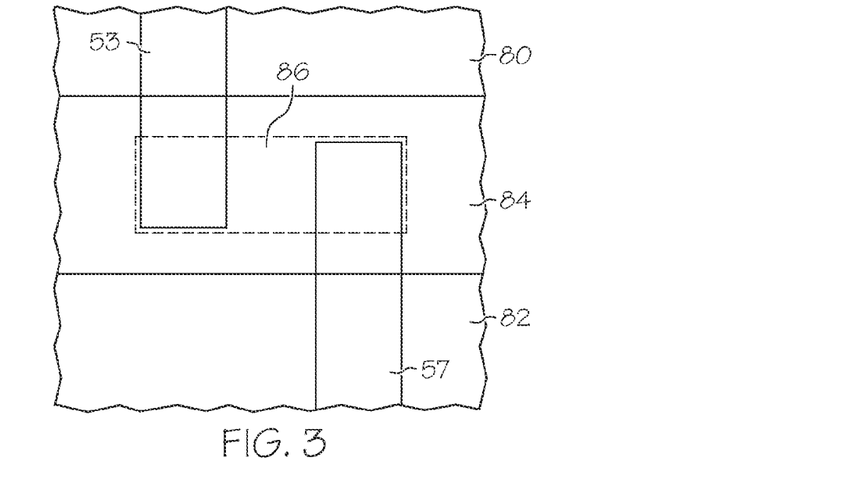
FIG. 3 illustrates, in plan view, a gate to gate connection in accordance with an embodiment.

FIG. 2 illustrates, in plan view, a conventional connection between the gates of two FETs such as the connection between gates 53 and 57 of FETs 52 and 56, respectively. PFET 52 is formed in and on an active area 80 and NFET 56 is formed in an on an active area 82. The two active areas are electrically isolated by an insulating region such as shallow trench isolation (STI) 84. The connection between the gates is typically made over the STI. In the conventional approach the connection between the gates is effected by a continuous gate electrode that may have a complicated shape such as the "S" shape illustrated. In future technology generations, as feature sizes are reduced, it will not be possible to photolithographically print and etch such complicated structures. In accordance with one embodiment the problem of gate to gate connection is overcome by the structure illustrated in plan view in FIG. 3. As illustrated, gates 53 and 57 are realized as unilateral gates that are easier to fabricate than the "S" shaped gates and the gate to gate connection is accomplished by a gate electrode material shorting bar 86 to be explained more fully below.

FIGS. 4-16 illustrate, in cross section, method steps in accordance with various embodiments for the fabrication of an integrated circuit 100. Various steps in the manufacture of ICs are well known to those of skill in the art and so, in the interest of brevity, many conventional steps will only be mentioned briefly herein or will be omitted entirely without providing the well known process details. Only a portion of IC 100 is depicted, that portion including portions of four FETS 102, 104, 106, and 108.

Figure 4:
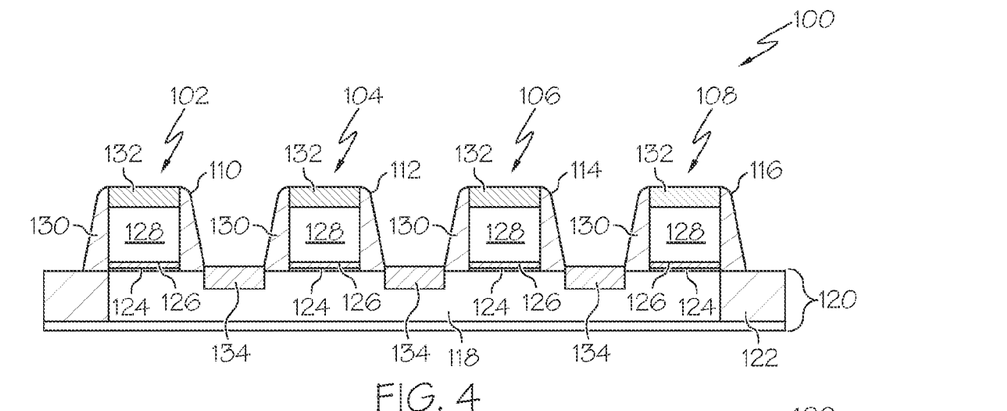
FIGS. 4-16 illustrate, in cross section, method steps in accordance with various embodiments for the fabrication of an integrated circuit.

As illustrated in FIG. 4, front end of line (FEOL) processing has been completed in conventional manner. At this stage in the fabrication, IC 100 includes four gate structures 110, 112, 114, and 116 formed overlying an active area 118 in a semiconductor substrate 120. Active area 118 is bounded by shallow trench isolation 122. Semiconductor substrate 120 can be a bulk wafer or a semiconductor on insulator (SOI) substrate and can be silicon, silicon admixed with germanium or carbon, or other semiconductor material used in the fabrication of integrated circuits. For simplicity of discussion, but without limitation, semiconductor substrate 120 will be referred to as a silicon substrate. The gate structures each include a gate dielectric 124, a metal cap 126 overlying the gate dielectric and a dummy gate electrode 128 overlying the metal cap. The gate dielectric preferably is a high dielectric constant (high k) material such as an oxide of hafnium, whereby "high k" is meant a material having a dielectric constant greater than the dielectric constant of silicon dioxide. The gate dielectric overlies the channel region of each of the FETs. The metal capping layer can be, for example, a layer of titanium nitride. The dummy gate electrode can be, for example, a polycrystalline silicon gate electrode. The gate structures also include sidewall spacers 130 and a gate cap 132. The sidewall spacers and gate cap can be, for example, silicon nitride. The gate cap is retained after previously being used as an etch mask to pattern the dummy gate electrodes.

Active area 118 is doped with conductivity-determining dopant impurities such as boron if the transistors being formed are NFETs and with phosphorus or arsenic if the transistors being formed are PFETS. Although not illustrated, source/drain regions are formed in the active area, for example by ion implantation using the gate structures as ion implantation masks. The source/drain regions are thus self-aligned to the gate structures. Metal silicide contacts 134 are formed, also self-aligned to the gate structures, to provide a low resistance contact to the source/drain regions. The metal silicide contacts are preferably nickel silicide contacts.

Figure 5:
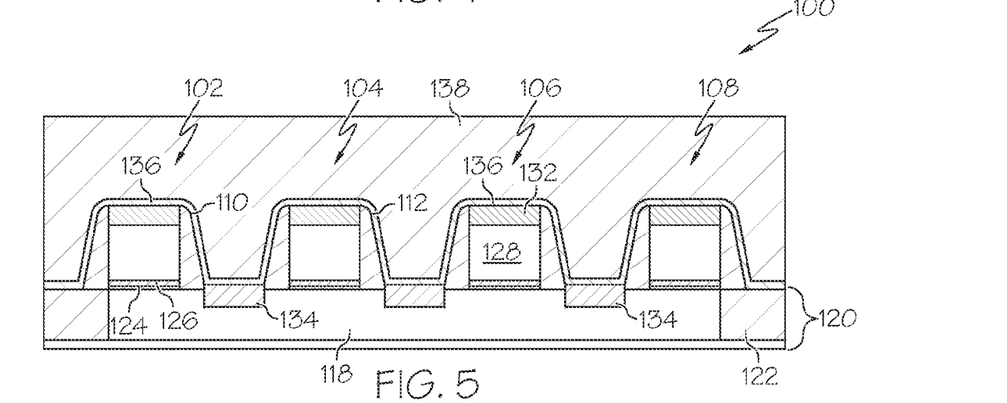

The method for fabricating IC 100, in accordance with one embodiment, continues as illustrated in FIG. 5 by depositing a layer of etch resistant material 136 such as a layer of silicon nitride having a thickness of about 5-15 nanometers (nm). The thin layer of etch resistant material serves as a stopping layer during a subsequent contact etch. A thick layer of oxide 138 is deposited overlying the layer of etch resistant material. The layer of oxide is of sufficient thickness to fill the gaps between the gate structures. Both the layer of etch resistant material and the layer of oxide can be deposited by a chemical vapor deposition process.

Figure 6:
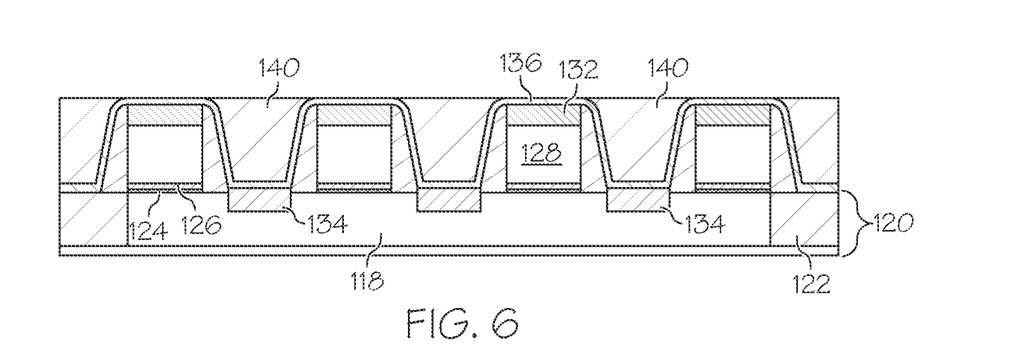
Figure 7:
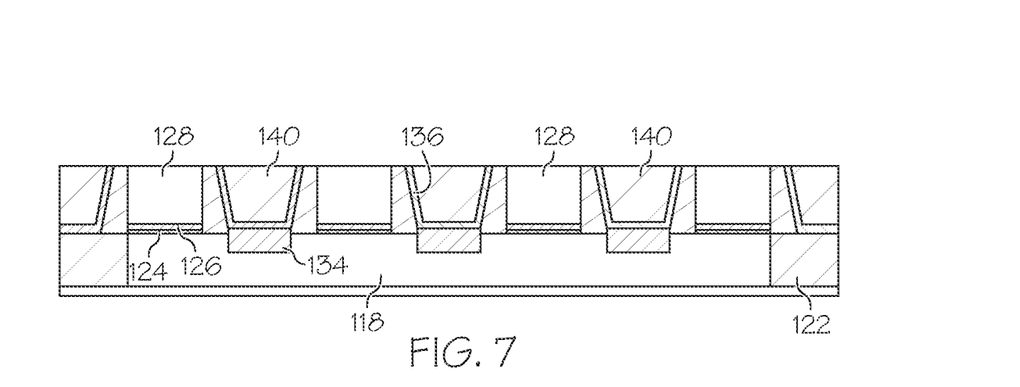

In accordance with one embodiment the method continues as illustrated in FIGS. 6 and 7. Thick oxide layer 138 is planarized, for example by chemical mechanical polishing (CMP) to provide a planar oxide surface 140. The CMP process uses the thin layer of etch resistant material 136 as a polish stop. The structure is further polished, again by CMP, using a timed polish step to remove the exposed portion of etch resistant layer 136 and gate cap 132 to expose the top of dummy gate electrodes 128.

Figure 8:
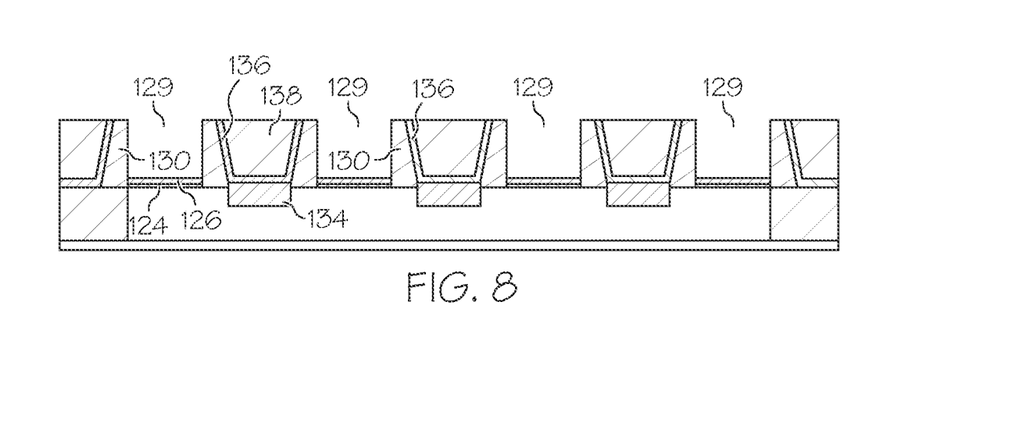

The dummy gate electrodes are removed as illustrated in FIG. 8. The polycrystalline silicon dummy gate electrodes can be removed by a wet etchant that etches silicon at a significantly greater etch rate than the etch rate of the remaining silicon oxide 138, the silicon nitride sidewall spacers 130, or the titanium nitride cap 126 overlying gate dielectric 124.

Removing the dummy gate electrodes 128 leaves trenches 129 overlying the channel regions of the FETs and bounded by sidewall spacers 130.

Figure 9:
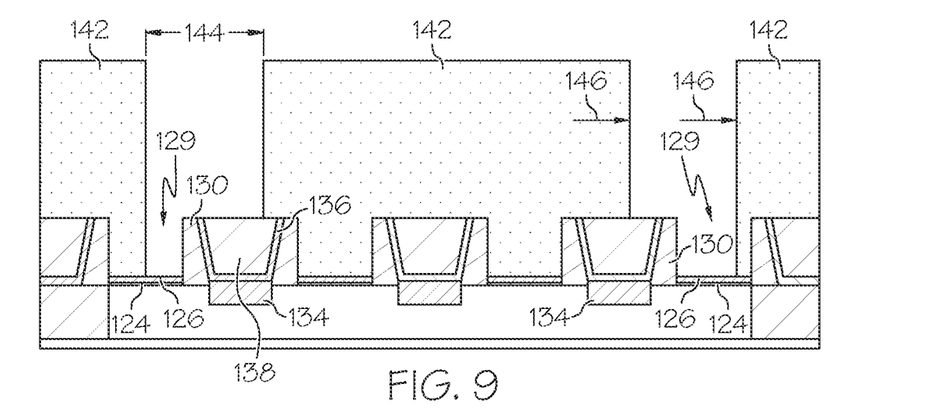

As illustrated in FIG. 9, the method in accordance with one embodiment continues by depositing and patterning a layer of photoresist or other masking material 142. The masking material is patterned to provide openings exposing at least a portion of the trenches 129 from which the dummy gate electrode was removed and a portion of the thick oxide layer 138 overlying an adjacent metal silicide contact 134. Portions of metal cap 126, thick oxide 138, and sidewall spacers 130 are exposed through the patterned masking material while other areas are protected from subsequent etching. Two variables that are important in photolithography, especially as feature sizes are decreased, are critical dimension (CD) variability as indicated by double headed arrow 144 and overlay variation as indicated by arrows 146. CD variation measures the variation in feature size on the wafer itself as compared to the design size. Overlay variation measures the variation in mask placement on the wafer as compared to the designed placement. Embodiments described herein allow for wide tolerances in both CD variation and overlay variation as will be explained more fully below.

Figure 10:
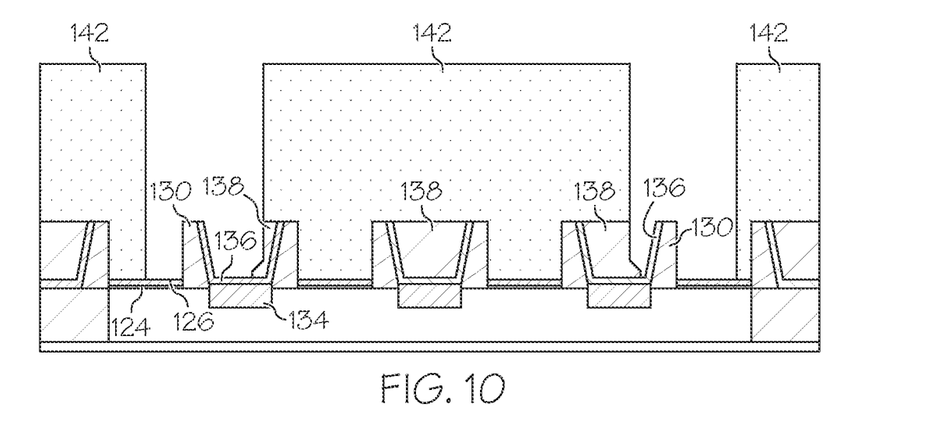
Figure 11:
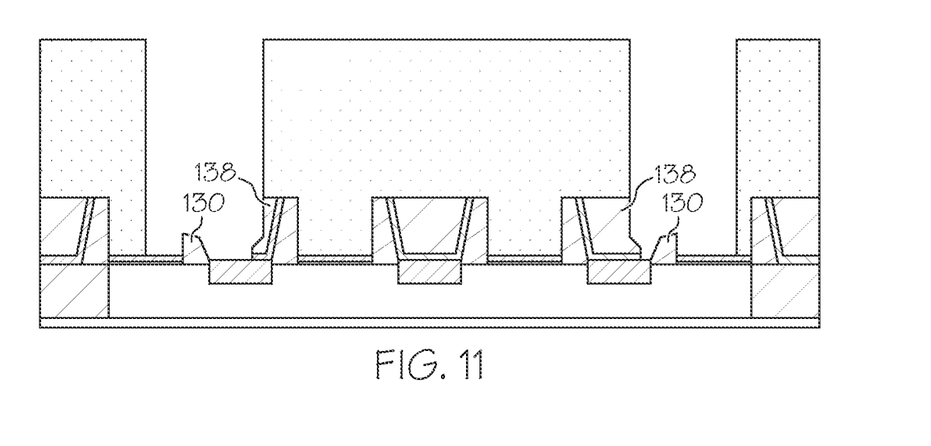

As illustrated in FIGS. 10 and 11, the patterned layer of masking material is used as an etch mask to first remove the exposed portion of thick oxide layer 138 overlying selected metal silicide contacts 134. Metal cap 126 and etch resistant layer 136 act as etch stop layers as the oxide is removed. It does not matter that the exposed metal cap or the underlying gate dielectric layer are damaged during this etch step because this etch does not occur over the channel regions of transistors 102 and 108; the channel regions of those transistors are located either into or out of the plane of the FIGURES and are protected during the etch by the patterned etch material. Following the removal of the exposed thick oxide, the exposed portion of etch resistant layer 136 is removed and the exposed sidewall spacer is recessed, that is, reduced in size and height, as illustrated in FIG. 11. If the etch resistant layer and the sidewall spacers are formed of silicon nitride, they can be removed or reduced in size, for example, by dry etching in an etchant that is selective to silicon nitride and that etches the metal silicide 134, capping layer 126, and thick oxide 138 at a much lower rate compared to the etch rate of the silicon nitride. In accordance with an alternate embodiment etching the silicon oxide 138 can be combined with etching the exposed silicon nitride 136 and 130 by employing a two-step etch recipe.

Figure 12:
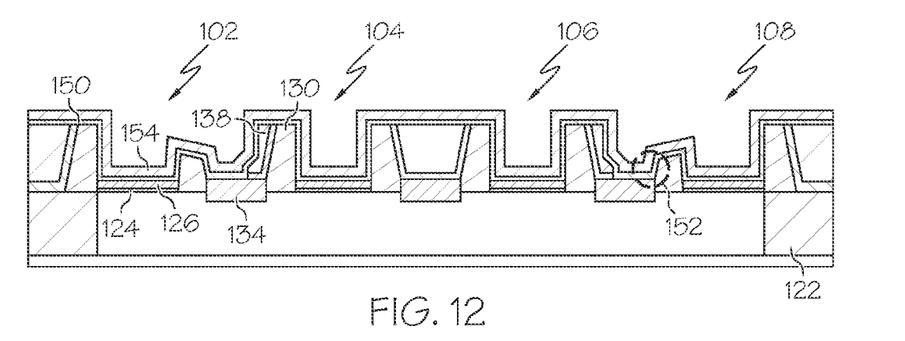

In accordance with one embodiment, the method for fabricating integrated circuit 100 continues as illustrated in FIG. 12 by the deposition of a layer of tantalum nitride 150 or other metal or conductive material that serves as an etch stop for the subsequent patterned removal of a layer of work function-determining metal for setting the threshold voltage of PFETs of the IC, and as a diffusion barrier. The diffusion barrier may be necessary to prevent the PFET work function-determining metal from touching the silicon substrate if CD variations, overlay variations, or over-etching during the sidewall spacer reduction have exposed an area of silicon, for example at the area indicated by circle 152. A layer of titanium nitride 154 or other PFET work function-determining material is deposited overlying the layer of tantalum nitride. Although not illustrated in FIG. 12 because all of FETs 102, 104, 106, and 108 are PFETs, the layer of titanium nitride is removed from the NFETs of the IC by etching using the layer of tantalum nitride as an etch stop.

Figure 13:
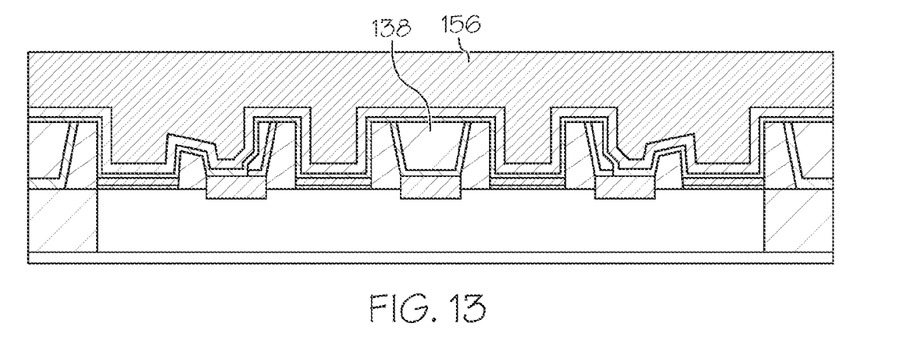
Figure 14:
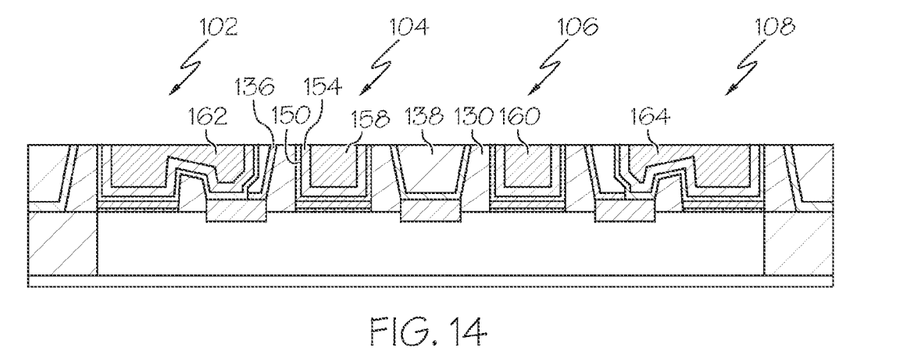

As illustrated in FIGS. 13 and 14, the method continues, in accordance with one embodiment, by depositing a layer of aluminum 156 or other gate electrode-forming material overlying the layer of titanium nitride (and tantalum nitride where that is exposed over NFETs). Germanium or other elements may be added to the aluminum to lower the reflow temperature of the metal to insure that all trenches and recesses are filled with the metal. Aluminum layer 156 is planarized, for example by CMP, with the planarization extending at least to the top portions of the sidewall spacers. The planarized aluminum forms replacement gate electrodes 158 and 160 of PFETs 104 and 106, respectively, and replacement gate electrodes and gate to active contacts 162 and 164 of PFETs 102 and 108.

Figure 15:
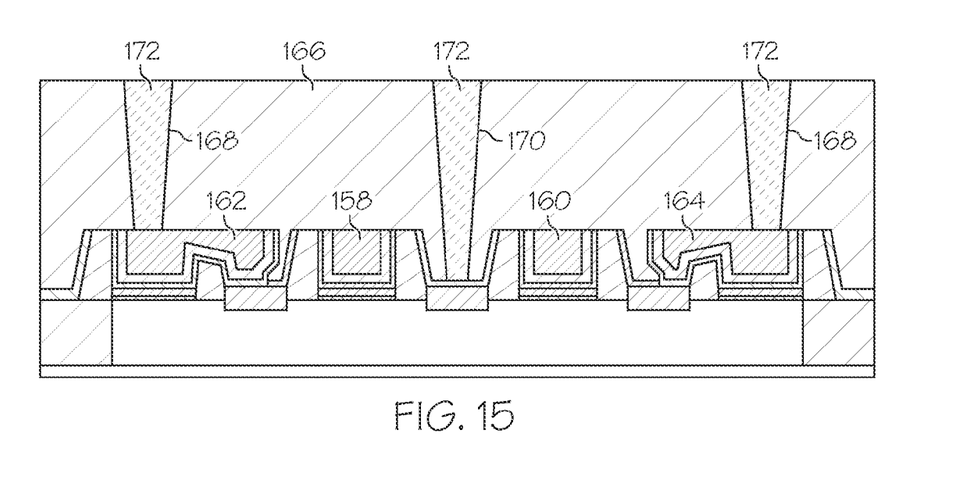

The method continues as illustrated in FIG. 15 by depositing a layer of interlayer dielectric (ILD) material 166 such as a layer of silicon oxide. Narrow contact openings 168 are etched through the ILD to expose portions of the gate to active contacts 162 and 164. Similarly, narrow contact openings 170 are etched through the ILD to expose a portion of metal silicide contact 134 forming the shared source/drain contact between replacement gate electrodes 158 and 160. The narrow contact openings 168 and 170 can be of the same size, so the openings can be etched uniformly without density variations. Openings 168 and 170 are filled with metal 172 such as tungsten plugs to provide electrical contact to the transistors as needed for the IC being fabricated.

Figure 16:
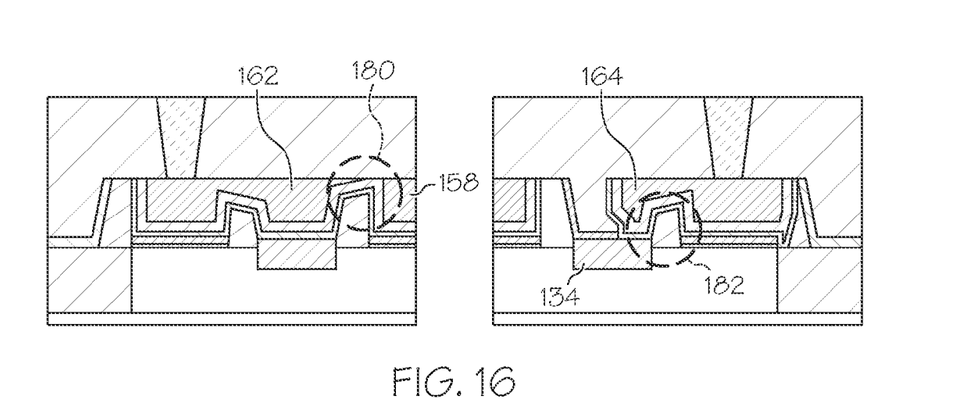

The above-described process, with all of its various embodiments, allows wide latitude in CD and overlay variability. The latitude with respect to patterned mask layer 142 (FIG. 9) is illustrated in FIG. 16. As indicated at the left of the FIGURE, the critical dimension must be maintained only sufficiently to insure that gate to active contact 162 does not expand so much that it causes a short between contact 162 and adjacent gate electrode 158 as indicated by circle 180. As indicated at the right of the FIGURE, the overlay variability must be controlled only enough to avoid marginal contact to the metal silicide contact 134 on the PFET active area source/drain region by the gate to active contact 164 as indicated by circle 182.

Figure 17:
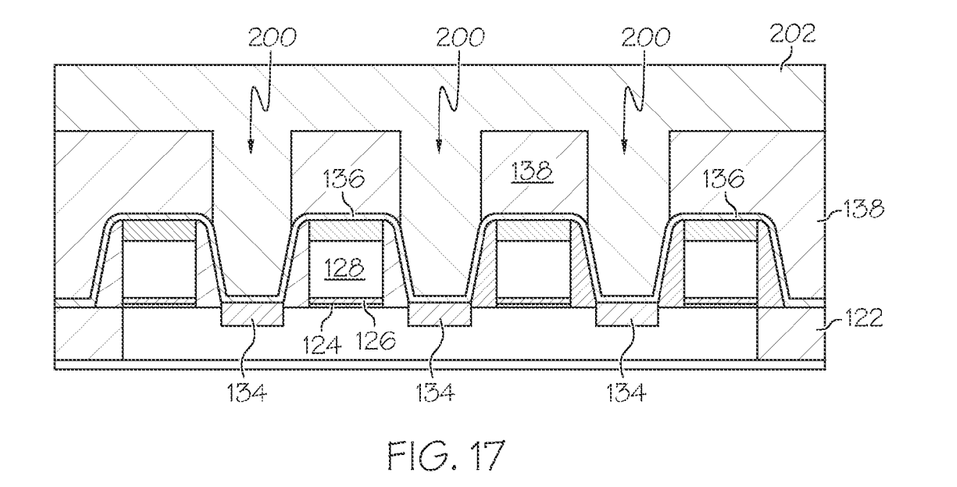
FIGS. 17-23, together with FIGS. 4 and 5, illustrate, in cross section, method steps for fabricating an integrated circuit in accordance with further embodiments.
Figure 18:
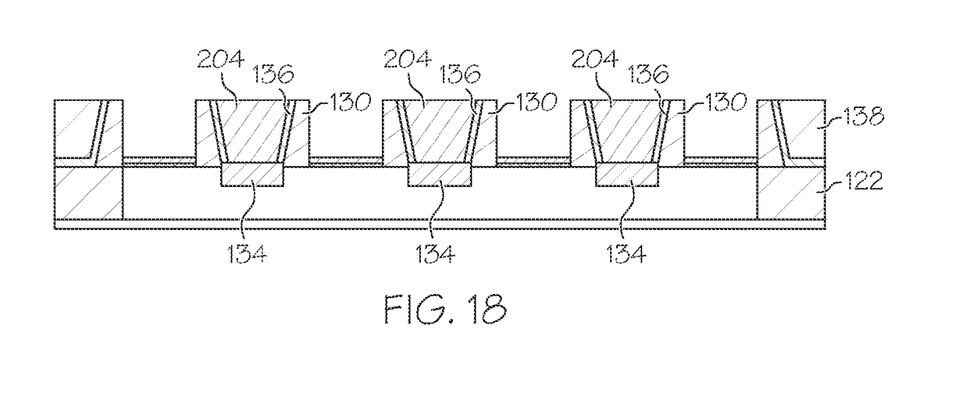

FIGS. 17-23, together with FIGS. 4 and 5, illustrate, in cross section, method steps for fabricating integrated circuit 100 in accordance with a further embodiment. This embodiment allows even greater mask tolerances (CD and overlay variations) than the previous embodiments. This embodiment begins in the same manner as illustrated in FIGS. 4 and 5. Following the deposition of thick oxide fill layer 138, the fill layer and etch resistant layer 136 are patterned and etched as illustrated in FIG. 17 to form openings 200 that expose metal silicide contacts 134 overlying the source/drain regions in active area 118. A metal layer 202 is deposited to fill the openings. The metal layer can be, for example, a layer of tungsten. An electrically conductive liner layer, not illustrated, may be deposited before depositing the tungsten.

Metal layer 202 is planarized, for example by CMP. The planarization of metal layer 202 can be combined with the planarization of thick oxide fill layer 138 and the exposure of the top portion of dummy gate electrodes 128 as previously illustrated in FIGS. 6 and 7. The dummy gate electrodes are removed to result in the structure illustrated in FIG. 18. The remaining portions of metal layer 202 form metallic contact bars 204 in electrical contact with metal silicide contacts 134. The metallic contact bars are bounded by etch resistant layer 136 and sidewall spacers 130.

Figure 19:
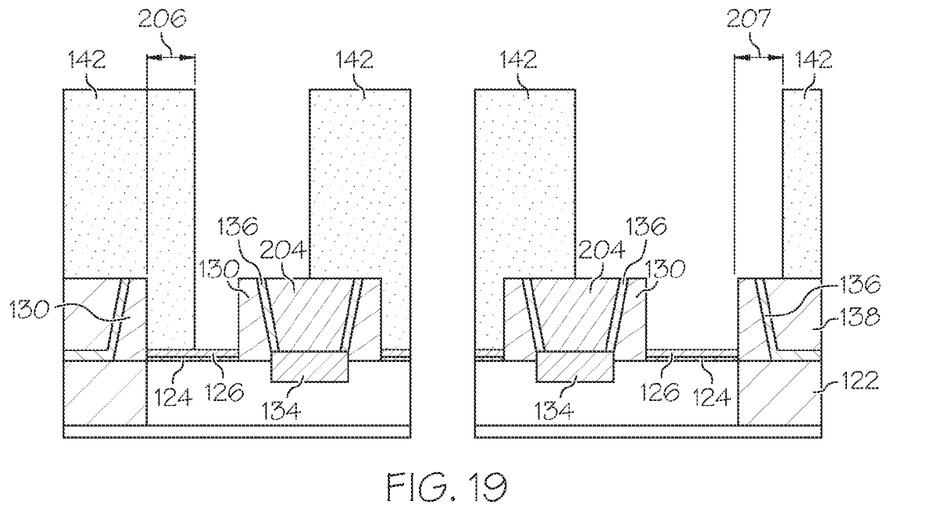
Figure 20:
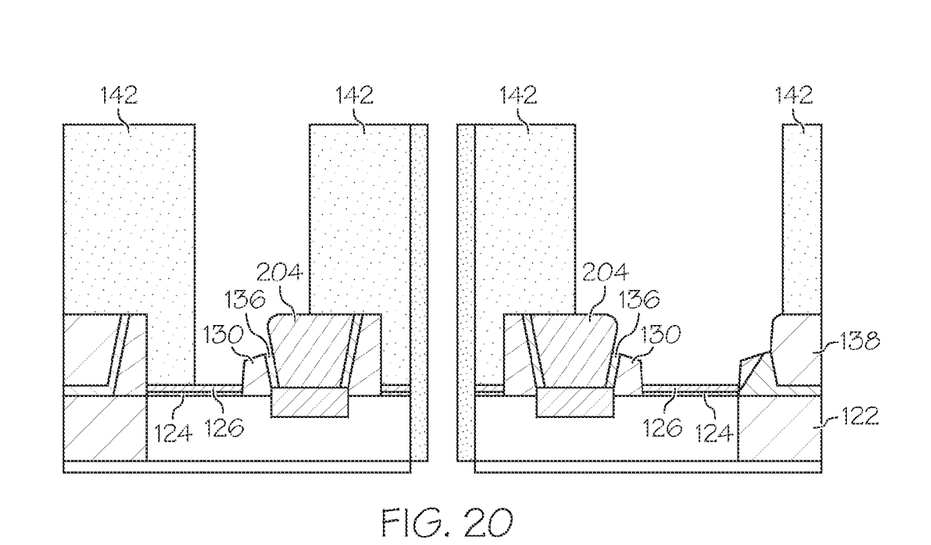

A layer of photoresist or other masking material 142 is deposited and patterned as illustrated in FIG. 19. This embodiment allows the mask tolerances to be loosened considerably, thus making the IC easier to fabricate. The left portion of FIG. 19 illustrates mask tolerances similar to those in FIG. 9. Patterned masking material 142 overlaps sidewall spacer 130 by an amount indicated by double headed arrow 206. In contrast, in accordance with the present embodiment, the patterned masking material can allow the exposure of sidewall spacer 130 as well as a portion of thick oxide 138 overlying STI 122 by an amount indicated by double headed arrow 207. The relaxed mask tolerances are possible because, as illustrated in FIG. 20, the masking layer is used as an etch mask to remove exposed portions of etch resistant layer 136 and sidewall spacers 130, but none of thick oxide layer 138 needs to be etched. The etch resistant layer and sidewall spacers are preferably formed of silicon nitride and can be etched in a RIE etchant that etches silicon nitride in preference to metal capping layer 126 (preferably titanium nitride), metallic contact bars 204 (preferably tungsten) and silicon oxide 138. Etch resistant layer 136 is removed and sidewall spacers 130 are recessed or reduced in height. Some corner rounding of the metallic contact bars and of the thick oxide overlying the STI may occur during the silicon nitride etching as is illustrated.

Figure 21:
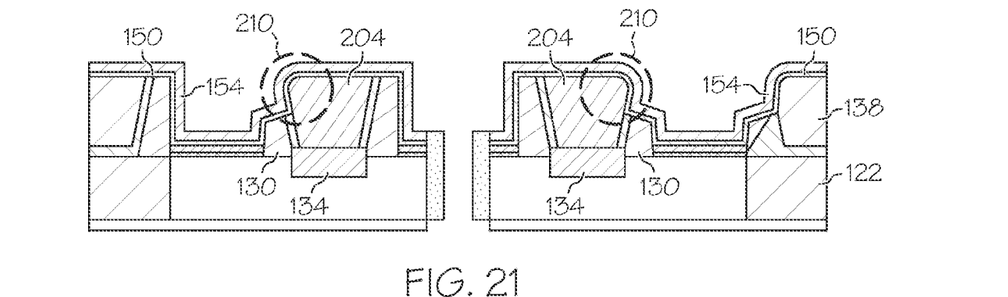

The patterned masking layer is removed and the method in accordance with this embodiment proceeds as illustrated in FIG. 21, similar to that illustrated in FIG. 12. A liner material 150 such as tantalum nitride and a work function-determining material 154 such as titanium nitride are deposited. The titanium nitride is removed from the NFETs (not illustrated). The electrical connection between the gate and the active area (source/drain region) metallic contact bar, marked with circle 210, is defined by the amount the height of sidewall spacer 130 is reduced as well as by the gate electrode material to be subsequently deposited and planarized. Accordingly, the reduction in the height of sidewall spacer 130 should be as great as possible to create a sufficient connection between the metallic contact bar and the gate electrode.

Figure 22:
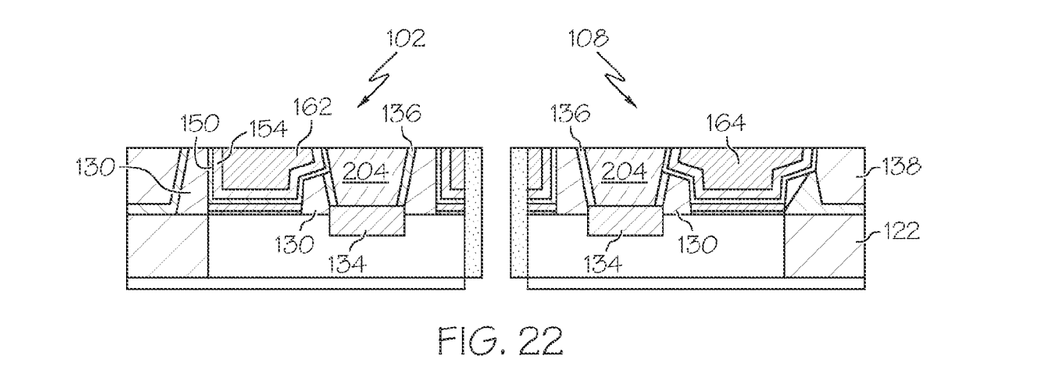
Figure 23:
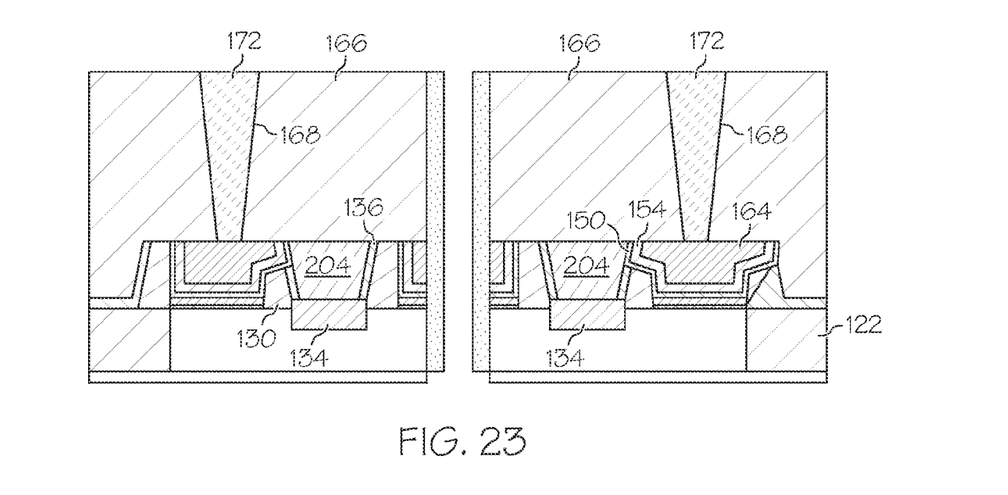

The method in accordance with this embodiment proceeds in the same manner as the method described above. A layer of aluminum or other gate electrode-forming material is deposited overlying the layer of titanium nitride (and tantalum nitride where that is exposed over NFETs). The aluminum layer is planarized, for example by CMP, with the planarization extending at least to the top portions of the sidewall spacers. The planarized aluminum forms replacement gate electrodes and gate to active contacts 162 and 164 of PFETs 102 and 108 as illustrated in FIG. 22. A layer of interlayer dielectric (ILD) material 166 such as a layer of silicon oxide is deposited over the planarized surface as illustrated in FIG. 23. Narrow contact openings 168 are etched through the ILD to expose portions of the gate to active contacts 162 and 164 as well as contacts to source/drain regions (not illustrated) in the active area. The narrow contact openings can be of the same size for both the gate to active contacts and to the source/drain regions, so the openings can be etched uniformly without density variations. Openings 168 are filled with metal 172 such as tungsten plugs to provide electrical contact to the transistors as needed for the IC being fabricated.

The methods described above can also be extended to implement gate to gate contacts as needed in the design and fabrication of IC 100. Implementation of gate to gate contacts will be described in accordance with the embodiments illustrated in FIGS. 4-16. Although not illustrated, the gate to gate connections can also be implemented in accordance with the alternate metallic contact bar embodiment. Fabrication of IC 100 including gate to gate contacts is illustrated in FIGS. 24-31. The fabrication steps are the same as described above, but are applied to a different portion of the IC. Accordingly, the steps need not be described in detail. The FIGURES are cross sectional views of a portion of IC 100 taken along the line 3-3 in FIG. 3.

Figure 24:
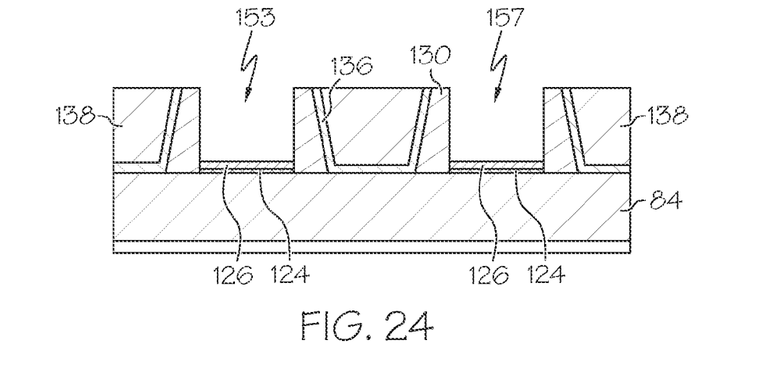
FIGS. 24-31, taken together with FIGS. 4-16, illustrate, in cross section, method steps for fabricating an integrated circuit having gate to gate contacts in accordance with still further embodiments.

As illustrated in FIG. 24, the region in which two gate structures 53 and 57 are to be connected overlies a portion of STI 84 (or 122 in FIG. 4) that provides isolation between active areas 80 in and on which a PFET 52 is to be formed and 82 in and on which an NFET 56 is to be formed. The two FETs are to be formed by a replacement gate process. The structure illustrated corresponds to the structure in FIG. 8 above. Dummy gate electrodes have been removed leaving two spaced apart trenches 153 and 157 overlying a metal cap 126 such as a layer of titanium nitride overlying a gate dielectric 124 which, in turn overlies the STI 84. Sidewall spacers 130, previously formed on the sidewalls of the dummy gate electrodes remain, as does a portion of thick oxide layer 138. The two trenches are spaced apart by the sidewall spacers and the remaining thick oxide fill layer. A portion of etch resistant layer 136 underlies the remaining thick oxide layer.

Figure 25:
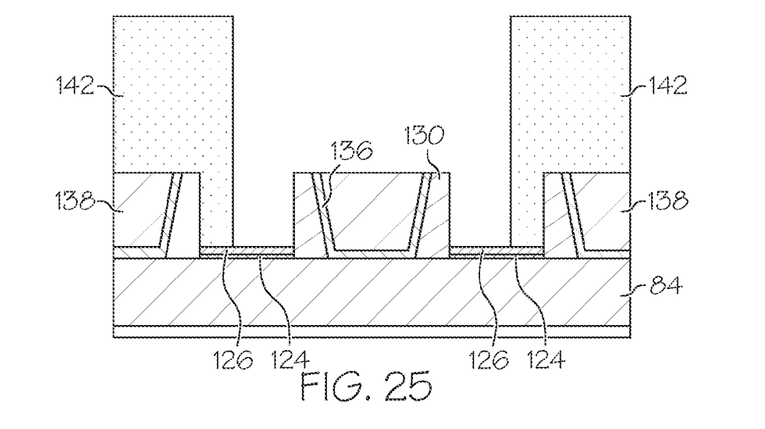

As illustrated in FIG. 25, a masking layer such as a layer of photoresist 142 is deposited and patterned to expose a portion of each of the metal cap layers as well as the portion of thick oxide and the sidewall spacers positioned between the spaced apart trenches. Using the mask layer as an etch mask the exposed thick oxide is removed in an etchant that preferentially etches the oxide at a faster etch rate than metal cap layer 126, sidewall spacers 130, and etch resistant layer 136 (compare FIG. 10). The etch resistant layer underlying thick oxide layer 138 prevents the etchant from attacking the STI.

Figure 26:
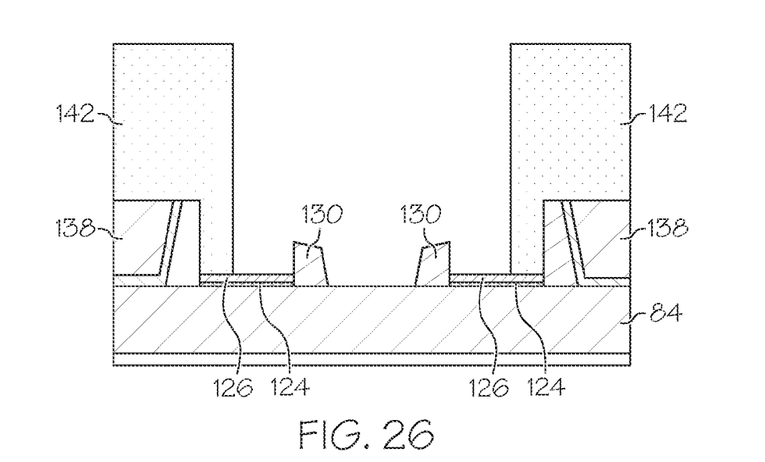

Again using the same patterned mask layer, the sidewall spacers 130 and etch resistant layer 136 are etched in an etchant that preferentially etches the sidewall spacers and etch resistant layer at a faster etch rate than the metal cap layer or the thick oxide layer. The etch resistant layer is removed and the height of the sidewall spacers is reduced as illustrated in FIG. 26 (compare FIG. 11).

Figure 27:
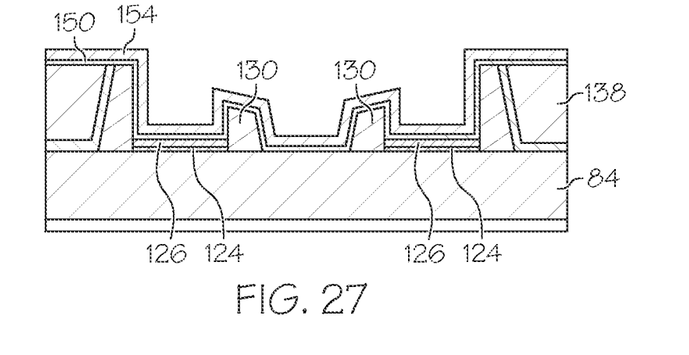

After removing the patterned masking layer, a liner layer such as a layer of tantalum nitride 150 is deposited over the structure. A layer of PFET work function-determining metal 154 such as a layer of titanium nitride is deposited overlying the liner layer as illustrated in FIG. 27 (compare FIG. 12).

Figure 28:
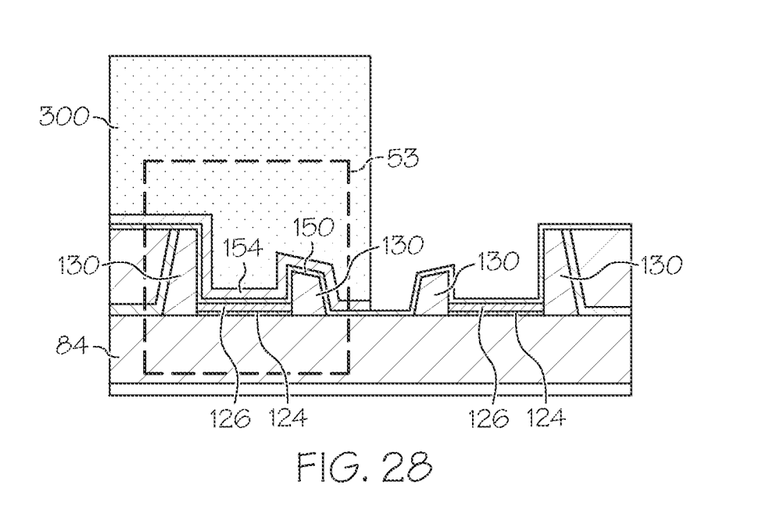

As illustrated in FIG. 28, a layer of photoresist 300 is deposited and patterned to protect PFET gate 53 area indicated by the dashed line while exposing NFET gate 57 area. The patterned layer of photoresist is used as an etch mask and the layer of PFET work function-determining metal overlying NFET gate 57 area is removed. Liner layer 150 is used as an etch stop to protect the metal cap layer 126.

Figure 29:
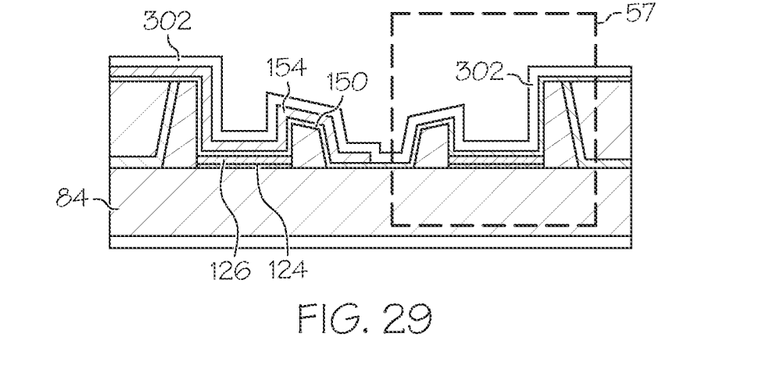

Layer of photoresist 300 is removed and a layer of NFET work function-determining metal 302 such as a layer of aluminum is deposited as illustrated in FIG. 29. The layer of aluminum on the layer of tantalum nitride determines the NFET work function in NFET gate area 57 indicated by the dashed line. Because of the layer of titanium nitride 154, the aluminum does not affect the work function on the PFET.

Figure 30:
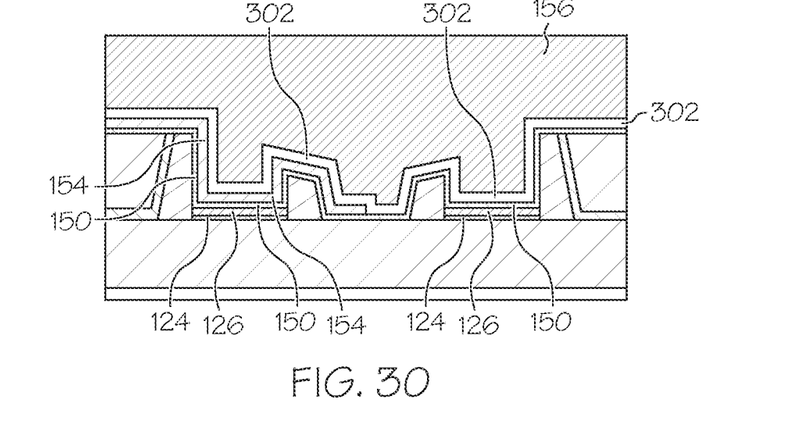
Figure 31:
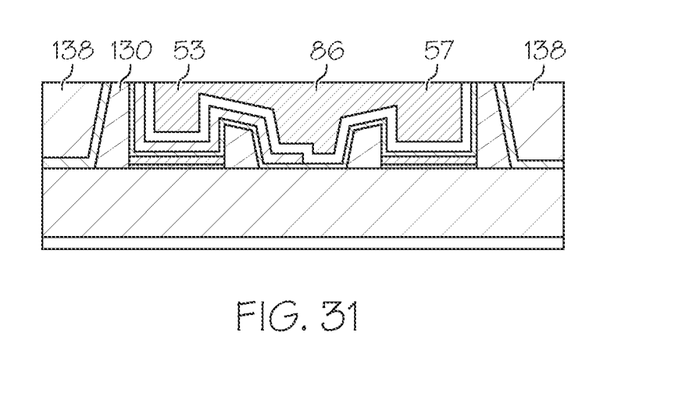

As illustrated in FIGS. 30 and 31, a layer of aluminum 156 is deposited over the layer of NFET work function-determining metal 302 (compare FIG. 13) to fill and bridge between the spaced apart trenches and is planarized, for example by CMP (compare FIG. 14). The planarization stops on the full height sidewall spacers 130 and the remaining thick oxide 138. The planarized aluminum forms gates 53 and 57 in addition to a gate to gate shorting bar 86 electrically connecting the gates. The shorting bar makes connection over the reduced height sidewall spacers between the two gates.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
  processing of the integrated circuit in a replacement gate technology including forming dummy gates, sidewall spacers on the dummy gates, and metal silicide contacts;
  depositing an etch resistant layer and a fill layer overlying the dummy gates and the metal silicide contacts;
  planarizing the fill layer and exposing a top portion of the dummy gates;
  removing the dummy gates overlying channel regions;
  depositing and patterning a mask layer to provide a mask opening overlying a portion of a channel region and a portion of an adjacent metal silicide contact;
  etching the fill layer, etch resistant layer and a portion of the sidewall spacers exposed through the mask opening to expose a portion overlying the adjacent metal silicide contact;
  depositing a gate electrode material overlying the channel region and the exposed portion overlying the adjacent metal silicide contact; and
  planarizing the gate electrode material to form a gate electrode and a gate-to-metal silicide contact interconnect.

2. The method of claim 1 further comprising:
  after depositing the fill layer, forming a patterned mask overlying the fill layer and having a mask opening overlying the metal silicide contacts;
  etching through the fill layer to expose the metal silicide contacts;
  depositing a layer of tungsten electrically contacting the metal silicide contacts; and
  planarizing the layer of tungsten while planarizing the fill layer.

3. The method of claim 2 wherein depositing and patterning a mask layer comprises depositing and patterning a mask layer to provide a mask opening overlying a portion of the tungsten layer and wherein depositing a gate electrode material comprises depositing a gate electrode material contacting the tungsten layer.

4. The method of claim 1 wherein depositing a gate electrode material comprises:
  depositing a layer of work function-determining material; and
  depositing a layer comprising aluminum.

5. The method of claim 1 wherein processing of the integrated circuit further comprises forming shallow trench isolation between first and second active areas and wherein forming dummy gates comprises forming a first dummy gate overlying the first active area and forming a second dummy gate overlying the second active area, the first dummy gate and the second dummy gate each having an end overlying the shallow trench isolation, and wherein depositing a fill layer further comprises depositing the fill layer overlying the shallow trench isolation, the method further comprising:
  removing the dummy gates overlying the shallow trench isolation to form first and second trenches spaced apart by the sidewall spacers and the fill layer;
  depositing and patterning the mask layer to provide a mask opening overlying a portion of the first and second trenches and the fill layer;
  etching the sidewall spacers between the spaced apart first and second trenches; and
  depositing the gate electrode material to fill and bridge between the spaced apart first and second trenches.

6. The method of claim 5 wherein depositing a gate electrode material comprises:
  depositing a layer of tantalum nitride;
  depositing a layer of titanium nitride overlying the layer of tantalum nitride;
  removing the titanium nitride overlying the first trench; and
  depositing a layer of metal comprising aluminum overlying the layer of titanium nitride and the layer of tantalum nitride.

7. The method of claim 1 wherein the sidewall spacers comprise silicon nitride, the dummy gates further comprise a silicon nitride cap and wherein depositing an etch resistant layer comprises depositing a layer of silicon nitride.

8. The method of claim 7 wherein planarizing the fill layer comprises:
  chemical mechanical planarizing the fill layer using the layer of silicon nitride as a polish stop; and
  further planarizing by chemical mechanical planarization to remove the silicon nitride etch cap and a portion of the etch resistant layer.

9. The method of claim 1 further comprising:
  depositing a layer of insulating material overlying the gate electrode and the gate-to-metal silicide contact interconnection;
  etching an opening through the layer of insulating material to expose one of the gate electrode or the gate-to-silicide contact interconnect; and
  filling the opening with metal to form an electrical contact to the gate electrode.

* * * * *